United States Patent
Wu et al.

(10) Patent No.: US 10,325,892 B2
(45) Date of Patent: Jun. 18, 2019

(54) LIGHT EMITTING DEVICE AND MANUFACTURING METHOD THEREOF

(71) Applicant: AU Optronics Corporation, Hsin-Chu (TW)

(72) Inventors: Tsung-Tien Wu, Hsin-Chu (TW); Chin-Yuan Ho, Hsin-Chu (TW); Tsung-Yi Lin, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/712,263

(22) Filed: Sep. 22, 2017

(65) Prior Publication Data
US 2018/0122788 A1 May 3, 2018

(30) Foreign Application Priority Data
Nov. 3, 2016 (TW) .............................. 105135755 A

(51) Int. Cl.
*H01L 25/16* (2006.01)
*H01L 33/38* (2010.01)
(Continued)

(52) U.S. Cl.
CPC .......... *H01L 25/167* (2013.01); *H01L 33/385* (2013.01); *H01L 27/1214* (2013.01);
(Continued)

(58) Field of Classification Search
CPC .......................... H01L 33/385; H01L 25/0753
See application file for complete search history.

(56) References Cited

U.S. PATENT DOCUMENTS

| 8,669,125 | B2 | 3/2014 | Truls |
| 9,450,151 | B2 * | 9/2016 | Choi ................. H01L 33/382 |

(Continued)

FOREIGN PATENT DOCUMENTS

| CN | 104269471 A | 1/2015 |
| CN | 105390580 A | 3/2016 |

(Continued)

OTHER PUBLICATIONS

Taiwan Intellectual Property Office, "Office Action" dated Jan. 6, 2017, Taiwan.

(Continued)

*Primary Examiner* — Yu-Hsi D Sun
(74) *Attorney, Agent, or Firm* — WPAT, PC

(57) ABSTRACT

A light emitting diode includes a semiconductor structure, a first electrode, a second electrode, and an extending electrode. The semiconductor structure has at least one sidewall and includes a light emitting layer, a first semiconductor layer, and a second semiconductor layer. The light emitting layer is disposed between the first semiconductor layer and the second semiconductor layer. The first electrode is electrically connected to the first semiconductor layer of the semiconductor structure. The first semiconductor layer is disposed between the light emitting layer and the first electrode. The second electrode is electrically connected to the second semiconductor layer of the semiconductor structure. The second semiconductor layer is disposed between the light emitting layer and the second electrode. The extending electrode is disposed on the sidewall of the semiconductor structure and is electrically connected to the second electrode.

12 Claims, 16 Drawing Sheets

(51) Int. Cl.
      *H01L 27/12*    (2006.01)
      *H01L 33/00*    (2010.01)
      *H01L 33/44*    (2010.01)
      *H01L 33/62*    (2010.01)

(52) U.S. Cl.
      CPC .......... *H01L 33/0079* (2013.01); *H01L 33/44* (2013.01); *H01L 33/62* (2013.01); *H01L 2933/0016* (2013.01); *H01L 2933/0033* (2013.01); *H01L 2933/0066* (2013.01)

(56) References Cited

U.S. PATENT DOCUMENTS

| | | | |
|---|---|---|---|
| 10,068,888 B2 * | 9/2018 | Zhang | ............ H01L 25/50 |
| 2016/0211427 A1 | 7/2016 | Jeong | |

FOREIGN PATENT DOCUMENTS

| | | |
|---|---|---|
| TW | 201611357 | 3/2016 |
| TW | M524561 U | 6/2016 |

OTHER PUBLICATIONS

National Intellectual Property Administration, PRC, "Office Action" dated Nov. 14, 2018.

\* cited by examiner

LIGHT EMITTING DEVICE AND MANUFACTURING METHOD THEREOF

BACKGROUND

Technical Field

The present invention relates to a light emitting device.

Related Art

In recent years, with the progress of science and technology and the increasing prosperity of the semiconductor industry, electronic products, for example, products such as a personal digital assistant (PDA), a mobile phone, a smart phone, and a notebook (NB), are used more and more widely, and are developed towards the direction of being convenient, multi-functional, and aesthetic, to provide more options for users. As the users have increasingly high requirements on the electronic products, designers also focus on display screens/panels that play an important role in the electronic products. However, besides advantages of high luminance and low power consumption of the display panels, the display panel design direction nowadays is to resolve disadvantages of dissatisfactory performance of light emitting devices in the display panels in aspects such as yield and reliability.

SUMMARY

An embodiment of the present invention provides a light emitting device, including a semiconductor structure, a first electrode, a second electrode, and an extending electrode. The semiconductor structure has at least one sidewall. The semiconductor structure includes a light emitting layer, a first semiconductor layer, and a second semiconductor layer. The light emitting layer is disposed between the first semiconductor layer and the second semiconductor layer. The first electrode is electrically connected to the first semiconductor layer of the semiconductor structure. The first semiconductor layer is disposed between the light emitting layer and the first electrode. The second electrode is electrically connected to the second semiconductor layer of the semiconductor structure. The second semiconductor layer is disposed between the light emitting layer and second electrode. The extending electrode is disposed on the sidewall of the semiconductor structure, and is electrically connected to the second electrode.

According to an embodiment of the invention, the semiconductor structure further has a top surface and a bottom surface that are opposite to each other. An angle is formed between the bottom surface and the at least one sidewall of the semiconductor structure, and the angle is an acute angle.

According to an embodiment of the invention, the area of the bottom surface of the semiconductor structure is greater than the area of the top surface of the semiconductor structure.

According to an embodiment of the invention, the second electrode protrudes from the second semiconductor layer.

According to an embodiment of the invention, the at least one sidewall of the semiconductor structure has at least one stair.

According to an embodiment of the invention, the light emitting device further includes a first insulating layer, at least disposed between the semiconductor structure and the extending electrode.

According to an embodiment of the invention, the height of the first insulating layer is lower than the height of the semiconductor structure.

According to an embodiment of the invention, the semiconductor structure further has a top surface, and the insulating layer further covers a part of the top surface and is adjacent to the first electrode.

According to an embodiment of the invention, the light emitting device further includes a substrate and an adhesive layer. The second electrode is disposed between the substrate and the semiconductor structure. The adhesive layer is disposed between the substrate and the second electrode.

According to an embodiment of the invention, the resistivity of the adhesive layer is greater than $10^8$ ohm-centimeter.

According to an embodiment of the invention, the light emitting device further includes an active element, a first conductive layer, a second conductive layer, a first connecting layer, and a second connecting layer. The active element is disposed between the substrate and the adhesive layer. The first conductive layer is disposed between the active element and the adhesive layer, and electrically connected to the active element. The second conductive layer is disposed between the active element and the adhesive layer, and the second conductive layer and the first conductive layer are separated by a gap. The first conductive layer is electrically connected to the semiconductor structure through the first connecting layer. The second conductive layer is electrically connected to the semiconductor structure through the second connecting layer.

According to an embodiment of the invention, the semiconductor structure is disposed on the first conductive layer.

According to an embodiment of the invention, the light emitting device further includes a second insulating layer. The second insulating layer covers a part of the extending electrode and the at least one sidewall of the semiconductor structure. The first connecting layer is disposed on the second insulating layer, and electrically connected to the first electrode and the first conductive layer. The second connecting layer is electrically connected to the extending electrode and the second conductive layer.

According to an embodiment of the invention, a part of the second connecting layer is further disposed between the second insulating layer and the extending electrode.

According to an embodiment of the invention, the light emitting device further includes a second insulating layer. The second insulating layer covers a part of the extending electrode and the at least one sidewall of the semiconductor structure. The first connecting layer is electrically connected to the extending electrode and the first conductive layer. The second connecting layer is disposed on the second insulating layer, and is electrically connected to the first electrode and the second conductive layer.

According to an embodiment of the invention, a part of the first connecting layer is further disposed between the second insulating layer and the extending electrode.

An embodiment of the present invention discloses a method of manufacturing a light emitting device, including: forming a semiconductor structure on a first substrate; forming a first electrode on the semiconductor structure; forming an extending electrode on at least one sidewall of the semiconductor structure, where the extending electrode and the first electrode are separated from each other; fastening the first electrode onto a second substrate, so that the semiconductor structure, the extending electrode, and the first electrode are disposed between the first substrate and the second substrate; separating the first substrate from the semiconductor structure; and forming a second electrode on a bottom surface of the semiconductor structure, so that the second electrode is electrically connected to the extending electrode.

According to an embodiment of the invention, the method further includes fastening the second electrode onto a third substrate; and separating the first electrode from the second substrate.

According to an embodiment of the invention, the manufacturing method further includes separating the second electrode from the third substrate, and fastening the semiconductor structure, the first electrode, the second electrode, and the extending electrode onto a circuit board through an adhesive layer, where the second electrode is in contact with the adhesive layer, the circuit board includes a first conductive layer and a second conductive layer, and the first conductive layer and the second conductive layer are separated from each other; forming a first connecting layer to cover at least a part of the extending electrode, and electrically connecting the first connecting layer to the first conductive layer; forming an insulating layer to cover at least a part of the first connecting layer; and forming a second connecting layer on the insulating layer, and electrically connecting the second connecting layer to the first electrode and the second conductive layer.

In the foregoing embodiments, as the extending electrode is disposed on the sidewall of the semiconductor structure, and is electrically connected to the second electrode, an external circuit can be connected to the extending electrode, to provide a current to the semiconductor structure. Such disposition can increase the contact area of electrical connection between the second electrode and the external circuit. In addition, as the adhesive layer is used as an adhesion medium for transposition processing in the foregoing embodiment, during transposition processing, high temperature and high pressure processing can be avoided, to improve the yield of the transposition processing.

DETAILED DESCRIPTION

Figure 1:
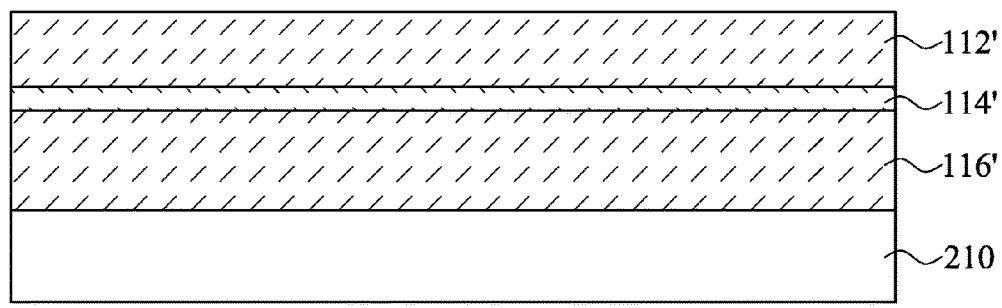
FIG. 1 to FIG. 15 are sectional views in a process of manufacturing a light emitting device according to an embodiment of the present invention.

The embodiments of the present invention are disclosed below with reference to the drawings. For clarity, many details during practice are also provided in the following descriptions. However, it should be understood that these details during practice are not intended to limit the present invention. That is, in some implementation manners of the present invention, these details during practice are not necessary. In addition, for the purpose of simplifying the drawings, some well-known and commonly-used structural elements are simply drawn in the drawings.

FIG. 1 to FIG. 15 are sectional views in a process of manufacturing a light emitting device 10 according to an embodiment of the present invention. For ease of description, the drawings of the present invention are merely examples for more easily understanding the present invention, and detailed scales thereof may be adjusted according to a design requirement. Referring to FIG. 1 first, a first substrate 210 is provided. In some embodiments, the first substrate 210 may be a conductive substrate, a semiconductor substrate, or an insulative substrate. The present invention is not limited thereto, and another type of substrate may be used when necessary.

A second semiconductor material layer 116', a light-emitting material layer 114', and a first semiconductor material layer 112' are formed on the first substrate 210 in sequence. In this embodiment, the first semiconductor material layer 112' is a P-type semiconductor layer (for example, a P-type gallium nitride layer, but the present invention is not limited thereto), the light-emitting material layer 114' is a multi-quantum well light emitting layer, and the second semiconductor material layer 116' is an N-type semiconductor layer (for example, an N-type gallium nitride layer, but the present invention is not limited thereto). Alternatively, the first semiconductor material layer 112' may be an N-type semiconductor layer, and the second semiconductor material layer 116' may be a P-type semiconductor layer. A method of forming the first semiconductor material layer 112', the light-emitting material layer 114', and the second semiconductor material layer 116' may be, for example, chemical vapor deposition (MOCVD), metal organic chemical vapor deposition (MOCVD), molecular beam epitaxial (MBE), or other appropriate epitaxial growth methods.

Figure 2:
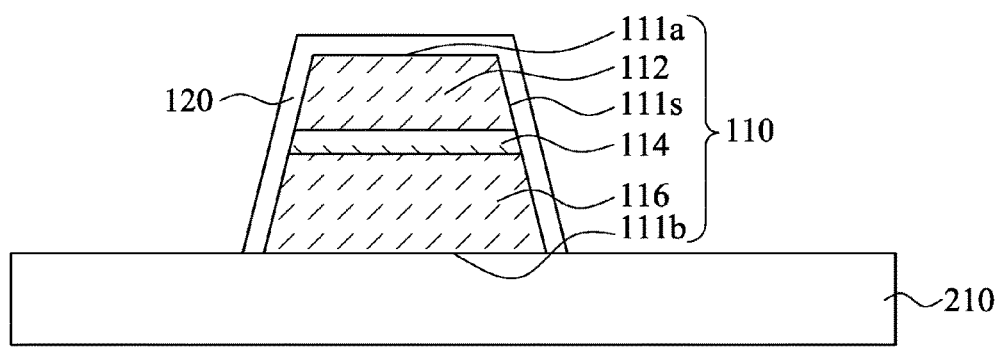

Referring to FIG. 2, the first semiconductor material layer 112', the light-emitting material layer 114', and the second semiconductor material layer 116' are patterned, to form a semiconductor structure 110 on the first substrate 210. The semiconductor structure 110 has a first semiconductor layer 112, a light emitting layer 114, and a second semiconductor layer 116. In some embodiments, a patterning method may be, for example, lithographic and etching processing or other appropriate patterning methods. The semiconductor structure 110 has a top surface 111a and a bottom surface 111b that are opposite to each other and at least one sidewall 111s. Specifically, the first semiconductor layer 112 has the top surface 111a, the second semiconductor layer 116 has the bottom surface 111b, the bottom surface 111b is in contact with the first substrate 210, and the sidewall 111s connects the top surface 111a and the bottom surface 111b.

Next, a first insulating layer 120 is formed to cover the semiconductor structure 110. Specifically, the first insulating layer 120 covers the top surface 111a and the sidewall 111s of the semiconductor structure 110. In some embodiments, the first insulating layer 120 may be made of a dielectric material, and a method of manufacturing the first insulating layer 120 may be plasma enhanced chemical vapor deposition (PECVD), but the present invention is not limited thereto, and other appropriate processing manners, such as screen printing, coating, and ink jet, may be used. In other embodiments, the first insulating layer 120 may be made of the following inorganic material and/or organic material. The inorganic material may be, for example, silicon oxide, silicon nitride, silicon oxynitride, silicon carbide, hafnium oxide, or aluminum oxide, or other appropriate materials. The organic material may be, for example, photoresist, benzocyclobutene, cycloalkene, polyimide, polyamide, polyester, polyol, polyethylene oxide, polyphenyl, resin, polyether, polyketone, or other appropriate materials. The foregoing descriptions are merely examples, and the present invention is not limited thereto.

Figure 3:
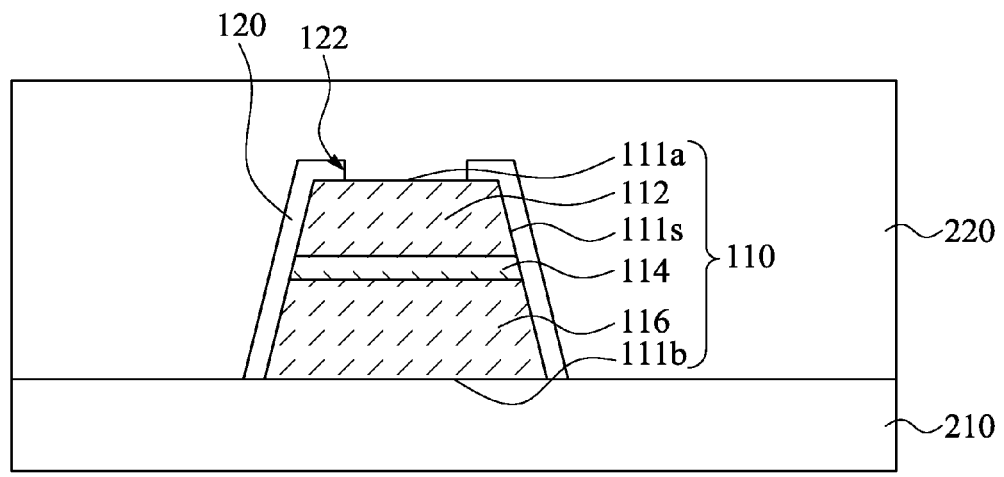

Referring to FIG. 3, the first insulating layer 120 is patterned to form a contact opening 122 in the first insulating layer 120, so that a part of the top surface 111a of the semiconductor structure 110 is exposed via the contact opening 122. In some embodiments, a method of patterning the first insulating layer 120 may be, for example, lithographic and etching processing or other appropriate patterning methods.

Next, a shade 220 is formed to cover the semiconductor structure 110, the first insulating layer 120, and the first substrate 210. The shade 220 may be made of photoresist or other appropriate materials. A method of forming the shade 220 may be coating or other appropriate methods.

Figure 4:
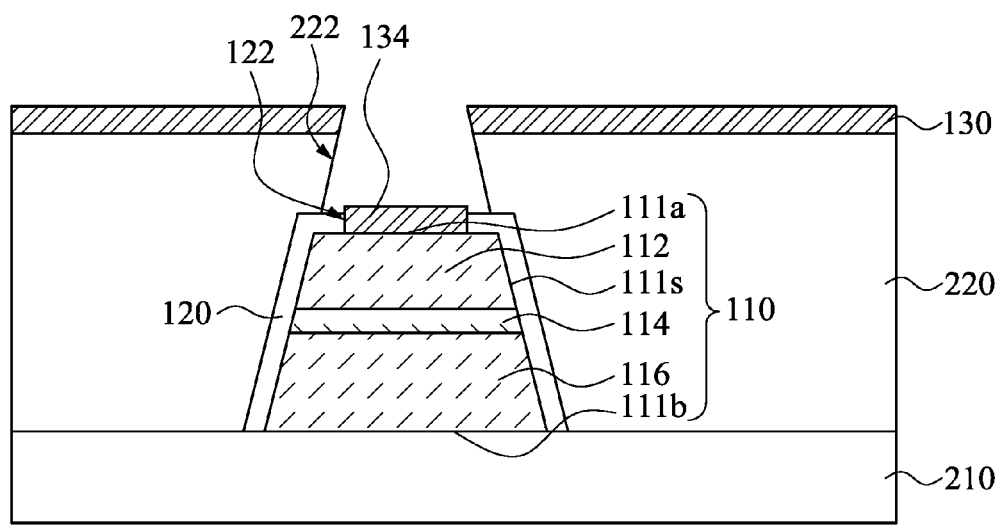

Referring to FIG. 4, the shade 220 is patterned to form an opening 222 in the shade 220. The opening 222 exposes at least the contact opening 122 of the first insulating layer 120, that is, the opening 222 also exposes the part of the top surface 111a of the semiconductor structure 110. In some embodiments, a method of patterning the shade 220 may be lithographic and etching processing or other appropriate patterning methods.

Next, a conducting layer 130 is formed thoroughly on the shade 220, and a part of the conducting layer 130 is formed on the top surface 111a of the semiconductor structure 110 via the opening 222 and the contact opening 122. The part of the conducting layer 130 is referred to as a first electrode 134. The first electrode 134 is electrically connected to the first semiconductor layer 112 of the semiconductor structure 110. In some embodiments, the conducting layer 130 may be made of metal, for example, silver, aluminum, copper, magnesium, or molybdenum, a composite layer of the materials or an alloy of the materials, but the present invention is not limited thereto.

Figure 5:
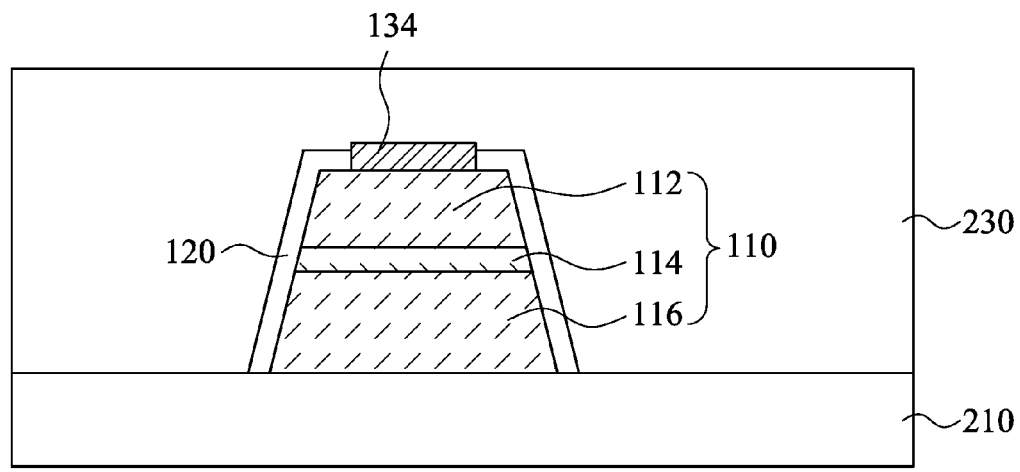

Referring to FIG. 5, the shade 220 in FIG. 4 is removed. In some embodiments, a method of removing the shade 220 may be lifting off using an adhesive tape or other appropriate methods. Next, another shade 230 is formed to cover the semiconductor structure 110, the first insulating layer 120, the first electrode 134, and the first substrate 210. The material of the shade 230 may be the same as or different from that of the shade 220 (shown in FIG. 3), that is, the shade 230 may be made of photoresist or other appropriate materials, and a method of forming the shade 230 may be coating or other appropriate methods.

Figure 6:
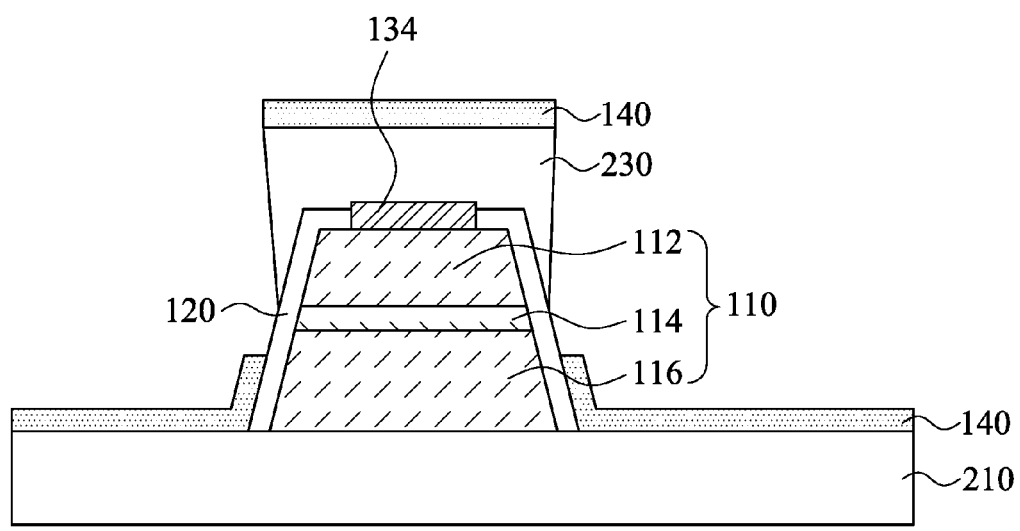

Referring to FIG. 6, the shade 230 is patterned to expose the substrate 210 and a part of the first insulating layer 120. In other words, the semiconductor structure 110, the first electrode 134, and the other part of the first insulating layer 120 are still covered by the shade 230. In some embodiments, a method of patterning the shade 230 may be lithographic and etching processing or other appropriate patterning methods.

Next, another conducting layer 140 is formed thoroughly on the shade 230, and a part of the conducting layer 140 is formed on the substrate 210 and the part of the first insulating layer 120, that is, a part of the conducting layer 140 is formed on the first insulating layer 120. In some embodiments, the material of the conducting layer 140 may be the same as or different from that of the conducting layer 130 (shown in FIG. 4), that is, the conducting layer 140 may be made of metal, for example, silver, aluminum, copper, magnesium, or molybdenum, a composite layer of the materials or an alloy of the materials, but the present invention is not limited thereto.

Figure 7:
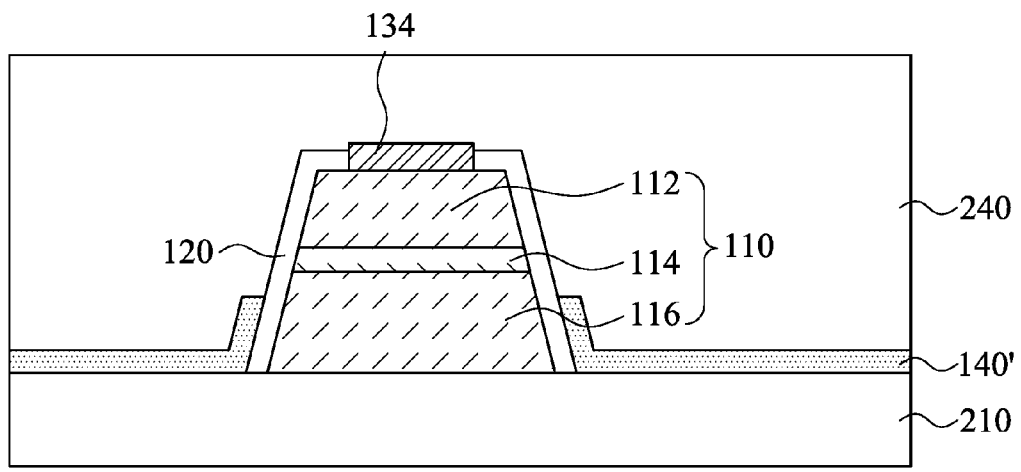

Referring to FIG. 7, the shade 230 in FIG. 6 and the part of the conducting layer 140 on the shade 230 are removed to form a patterned conducting layer 140' on the substrate 210 and the part of the first insulating layer 120. In some embodiments, a method of removing the shade 230 may be lifting off using an adhesive tape or other appropriate methods. Next, another shade 240 is formed to cover the semiconductor structure 110, the first insulating layer 120, the first electrode 134, and the patterned conducting layer 140'. The material of the shade 240 may be the same as or different from that of the shade 220 (shown in FIG. 3), that is, the shade 240 may be made of photoresist or other appropriate materials, and a method of forming the shade 240 may be coating or other appropriate methods.

Figure 8:
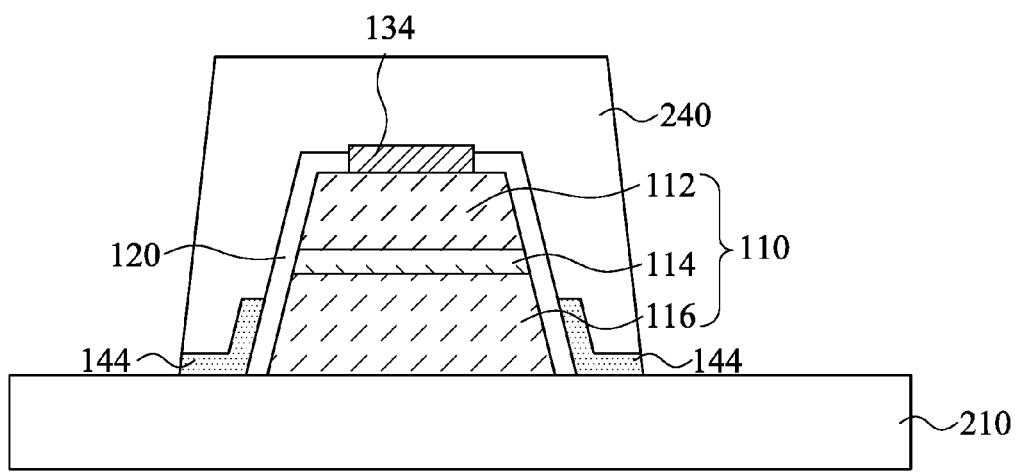

Referring to FIG. 8, the shade 240 is patterned to expose a part of the patterned conducting layer 140'. In other words, the semiconductor structure 110, the first insulating layer 120, the first electrode 134, and the other part of the patterned conducting layer 140' are still covered by the shade 240. In some embodiments, a method of patterning the shade 240 may be lithographic and etching processing or other appropriate patterning methods.

Next, the part of the patterned conducting layer 140' that is exposed by the shade 240 is removed to form an extending electrode 144. A removing method may be etching or other appropriate methods. In this embodiment, the extending electrode 144 is disposed on a sidewall of the first insulating layer 120 and the first substrate 210. A part of the extending electrode 144 that is disposed on the first substrate 210 can increase the area of contact with a subsequently formed second electrode 154 (shown in FIG. 12). However, in other embodiments, the extending electrode 144 disposed on the first substrate 210 may be omitted.

Figure 9:
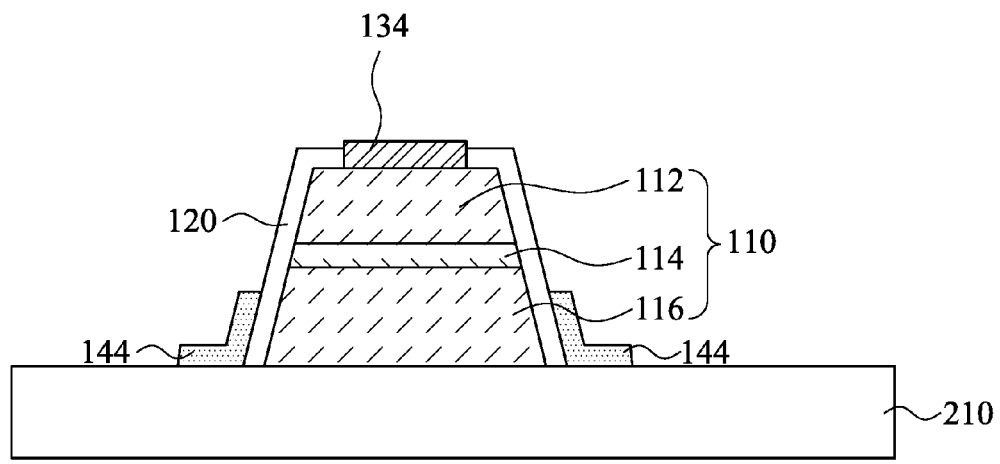

Referring to FIG. 9, the shade 240 in FIG. 8 is removed. In some embodiments, a method of removing the shade 240 may be lifting off using an adhesive tape or other appropriate methods.

Figure 10:
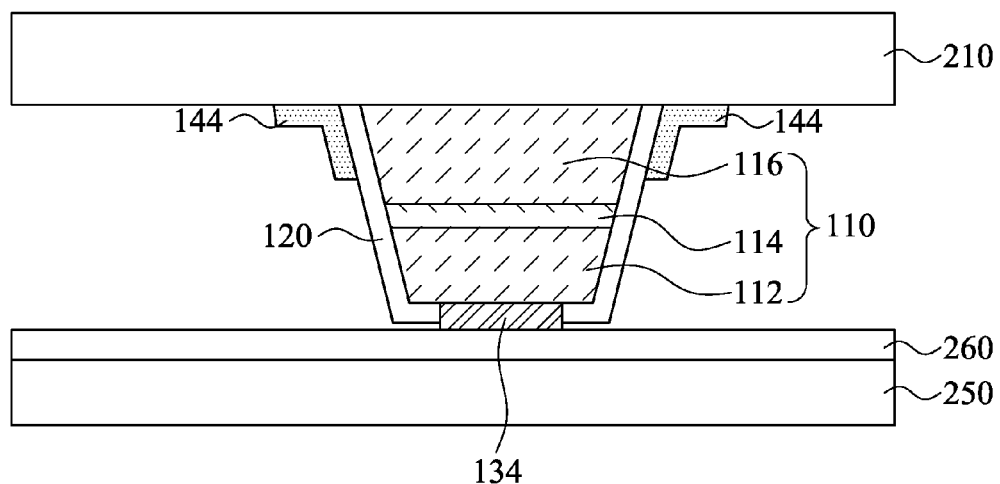

Referring to FIG. 10, next, the structure in FIG. 9 is turned over, and is fastened onto a second substrate 250. Specifically, the second substrate 250 has a bonding layer 260, and the structure in FIG. 9 is bonded to the bonding layer 260 through the first electrode 134 and fastened onto the second substrate 250. Therefore, the semiconductor structure 110, the extending electrode 144, the first insulating layer 120, and the first electrode 134 are all disposed between the first substrate 210 and the second substrate 250. In some embodiments, the bonding layer 260 may be an adhesive layer or a solder, and the present invention is not limited thereto. The second substrate 250 may be a conductive substrate, a semiconductor substrate, or an insulative substrate. The present invention is not limited thereto, and another type of substrate may be used when necessary.

Figure 11:
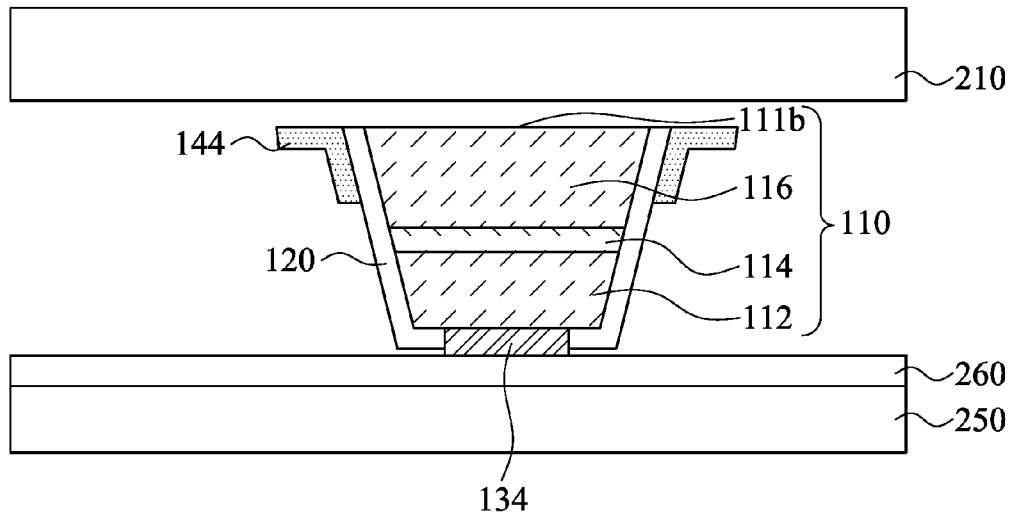

Referring to FIG. 11, the first substrate 210 is separated from the semiconductor structure 110. For example, laser lift off (LLO) or other appropriate methods may be used to remove the first substrate 210. When the LLO is used to lift off the first substrate 210, a back side of the first substrate 210 (that is, a side far away from the semiconductor structure 110) may be illuminated by using laser, to lift off the first substrate 210, to expose the bottom surface 111b of the semiconductor structure 110.

Figure 12:
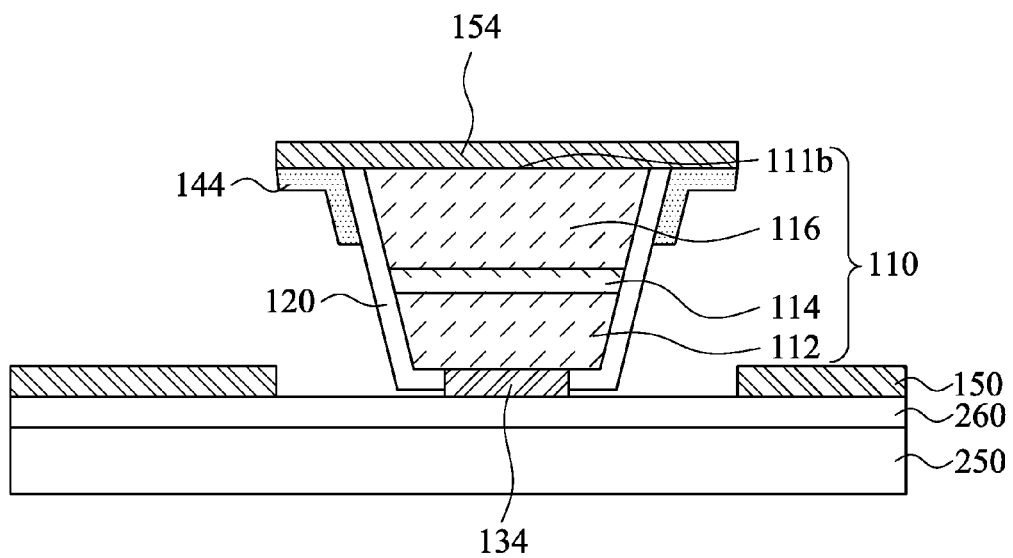

Referring to FIG. 12, another conducting layer 150 is formed thoroughly on the bottom surface 111b of the semiconductor structure 110 and the second substrate 250. In this embodiment, a part of the conducting layer 150 is formed on the bottom surface 111b of the semiconductor structure 110 and the extending electrode 144, and the part of the conducting layer 150 is referred to as a second electrode 154. Therefore, the second electrode 154 is electrically connected to the second semiconductor layer 116 of the semiconductor structure 110 and the extending electrode 144. In some embodiments, the material of the conducting layer 150 may be the same as or different from that of the conducting layer 130 (shown in FIG. 4), that is, the conducting layer 150 may be made of metal, for example, silver, aluminum, copper, magnesium, or molybdenum, a composite layer of the materials or an alloy of the materials, but the present invention is not limited thereto.

Figure 13:
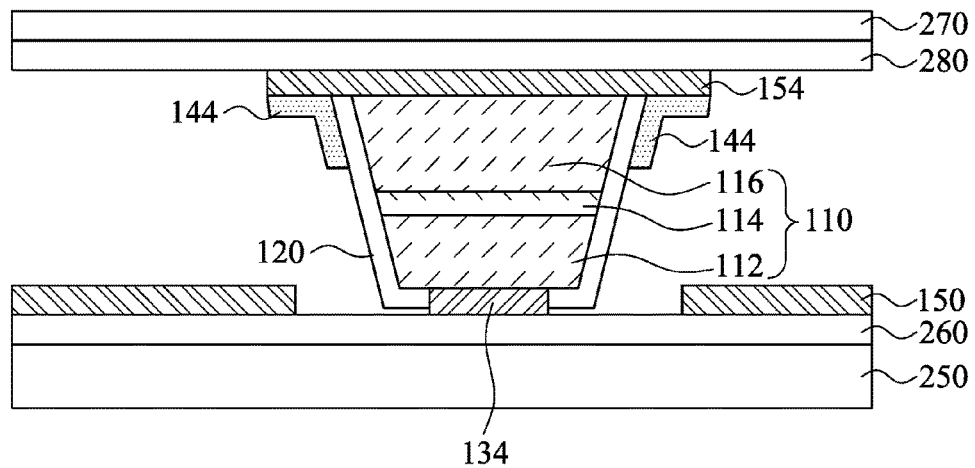

Referring to FIG. 13, the second electrode 154 is fastened onto a third substrate 270. Specifically, the third substrate 270 has another bonding layer 280, and the structure in FIG. 12 is bonded to the bonding layer 280 through the second electrode 154 and fastened onto the third substrate 270. In this way, the semiconductor structure 110, the first insulating layer 120, the first electrode 134, the extending electrode 144, and the second electrode 154 are all disposed between the second substrate 250 and the third substrate 270. In some embodiments, the bonding layer 280 may be an adhesive layer or a solder, and the present invention is not limited thereto. The third substrate 270 may be a conductive substrate, a semiconductor substrate, or an insulative substrate. The present invention is not limited thereto, and another type of substrate may be used when necessary.

Figure 14:
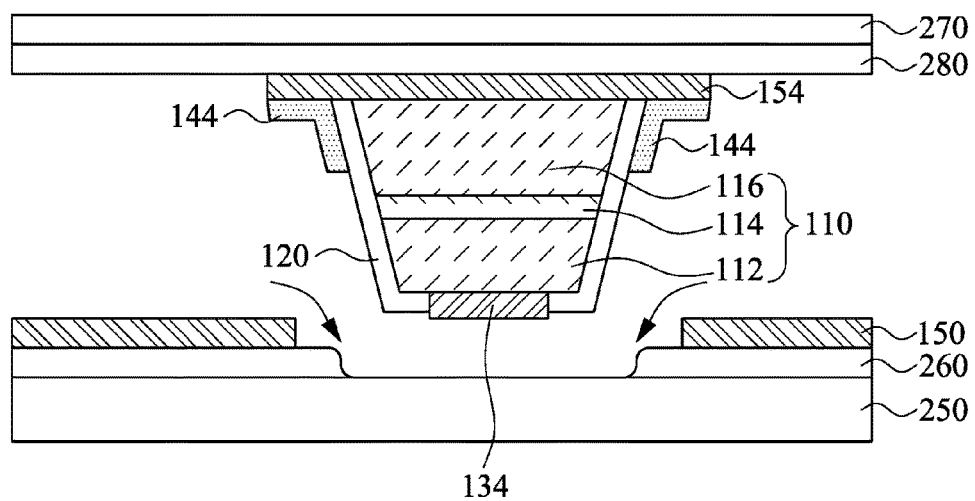
Figure 15:
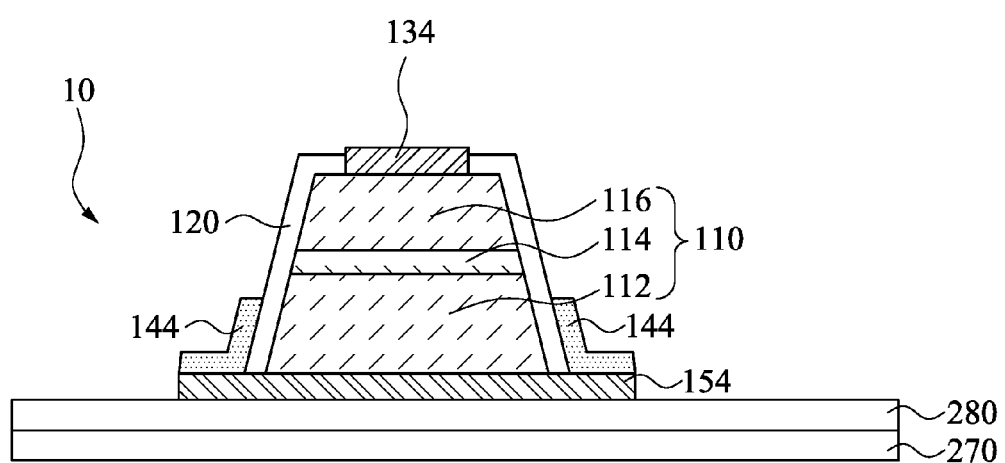

Referring to FIG. 14, the first electrode 134 is separated from the second substrate 250. For example, a chemical lift off method may be used to etch the bonding layer 260, to lift off the bonding layer 260 from the first electrode 134. Then, as shown in FIG. 15, the structure in FIG. 14 (except the removed second substrate 250 and bonding layer 260) is turned over, and the light emitting device 10 in this embodiment (that is, the structure disposed on the third substrate 270 and the bonding layer 280) is finished.

Figure 16:
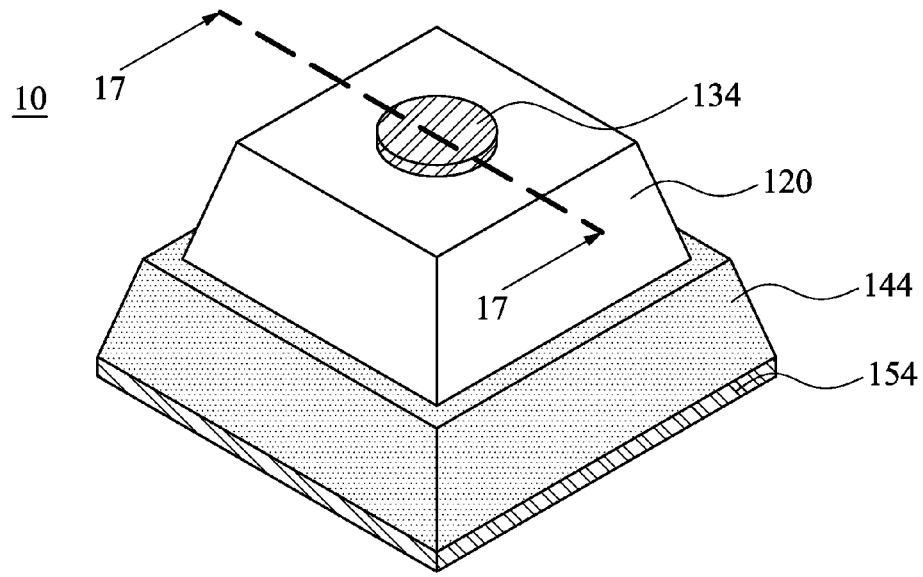
FIG. 16 is a three-dimensional diagram of a light emitting device according to an embodiment of the present invention.
Figure 17:
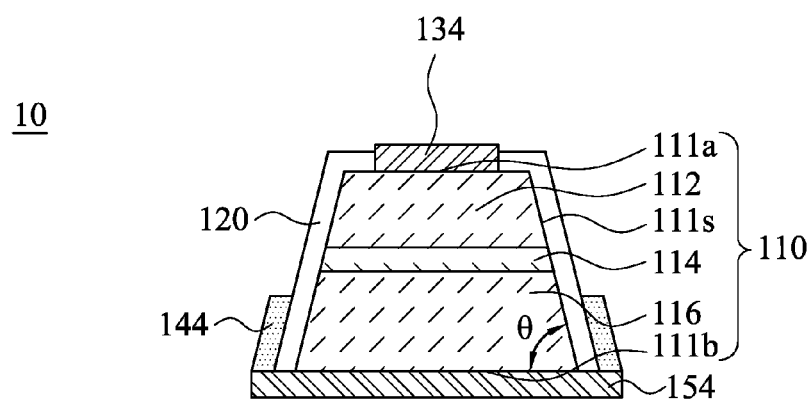
FIG. 17 is a sectional view along a line 17-17 in FIG. 16.

Referring to FIG. 16 and FIG. 17, FIG. 16 is a three-dimensional diagram of a light emitting device 10 according to an embodiment of the present invention, and FIG. 17 is a sectional view along a line 17-17 in FIG. 16. The light emitting devices 10 in FIG. 17 and FIG. 15 have similar structures. As seen from the structure, the light emitting device 10 includes a semiconductor structure 110, a first electrode 134, a second electrode 154, and an extending electrode 144. The semiconductor structure 110 has at least one sidewall 111s. The semiconductor structure 110 includes a light emitting layer 114, a first semiconductor layer 112, and a second semiconductor layer 116. The light emitting layer 114 is disposed between the first semiconductor layer 112 and the second semiconductor layer 116. The first electrode 134 is electrically connected to the first semiconductor layer 112 of the semiconductor structure 110. For example, the first electrode 134 is in contact with the first semiconductor layer 112. The first semiconductor layer 112 is disposed between the light emitting layer 114 and the first electrode 134. The second electrode 154 is electrically connected to the second semiconductor layer 116 of the semiconductor structure 110. For example, the second electrode 154 is in contact with the second semiconductor layer 116. The second semiconductor layer 116 is disposed between the light emitting layer 114 and second electrode 154. The extending electrode 144 is disposed on the sidewall 111s of the semiconductor structure 110, and is electrically connected to the second electrode 154.

The foregoing structure is a vertical light emitting device (or a vertical light emitting diode chip). That is, the first electrode 134 and the second electrode 154 are respectively located on a top surface 111a and a bottom surface 111b of the semiconductor structure 110 that are opposite to each other. When a current is applied, the current essentially runs through the semiconductor structure 110 vertically. Therefore, a problem of uneven current distribution can be mitigated. In this embodiment, as the extending electrode 144 is disposed on the sidewall 111s of the semiconductor structure 110, and is electrically connected to the second electrode 154, an external circuit can be connected to the extending electrode 144, to provide a current to the semiconductor structure 110. Such disposition can increase the contact area of electrical connection between the second electrode 154 and the external circuit.

In FIG. 16, the semiconductor structure 110 is in a shape of a square platform. Therefore, the semiconductor structure 110 has four sidewalls 111s (shown in FIG. 17). It should be noted that, in FIG. 16, the extending electrode 144 is disposed on the four sidewalls 111s of the semiconductor structure 110, but the present invention is not limited thereto. In other embodiments, the extending electrode 144 may be disposed on one sidewall 111s, two sidewalls 111s, or three sidewalls 111s of the semiconductor structure 110, as long as the extending electrode 144 is disposed on the at least one sidewall 111s of the semiconductor structure 110, which all fall within the scope of the present invention. In addition, in other embodiments, the semiconductor structure 110 may be in a shape of a cylinder, a multi-angular column, a circular platform, or a polygonal platform, but the present invention is not limited thereto, and the extending electrode 144 is disposed on some or all sidewalls 111s of the semiconductor structure 110.

Referring to FIG. 17, an angle θ is formed between the bottom surface 111b and the sidewall 111s of the semiconductor structure 110, and the angle θ is an acute angle (that is, less than 90 degrees). In other words, the area of the bottom surface 111b is greater than the area of the top surface 111a. Such a structure helps the extending electrode 144 to deposit on the sidewall 111s of the semiconductor structure 110 (that is, the step in FIG. 6).

In this embodiment, the light emitting device 10 further includes a first insulating layer 120, at least disposed between the semiconductor structure 110 and the extending electrode 144. For example, in FIG. 16 and FIG. 17, the first insulating layer 120 completely covers the sidewall 111s of the semiconductor structure 110 and a part of the top surface 111a, and the first insulating layer 120 is adjacent to the first electrode 134. The first insulating layer 120 can separate the semiconductor structure 110 from the extending electrode 144. Therefore, a current path of the extending electrode 144 is from the second electrode 154 to the semiconductor structure 110, to increase the vertical current flow of the light emitting device 10. In addition, as the first insulating layer 120 covers all sidewalls 111s of the semiconductor structure 110, electric leakage of the semiconductor structure 110 or other current interference can also be avoided.

In some embodiments, the second electrode 154 protrudes from the second semiconductor layer 116, to increase the contact area between the second electrode 154 and the extending electrode 144 on the sidewall 111s of the semiconductor structure 110, so that the second electrode 154 can be electrically connected to the extending electrode 144 well. If the light emitting device 10 further includes the first insulating layer 120 (as described in the embodiment of FIG.

16 and FIG. 17), the second electrode 154 may further protrude from the first insulating layer 120.

Figure 18:
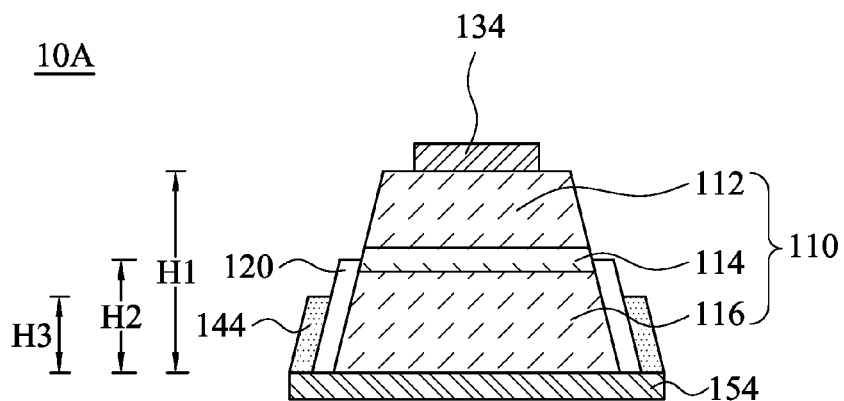
FIG. 18 is a sectional view of a light emitting device according to another embodiment of the present invention.

FIG. 18 is a sectional view of a light emitting device 10A according to another embodiment of the present invention. The difference between FIG. 18 and FIG. 17 resides in the first insulating layer 120. In FIG. 18, the semiconductor structure 110 has a height of H1, and the first insulating layer 120 has a height of H2. The height H1 is greater than the height H2, that is, the first insulating layer 120 covers only a part of the sidewall 111s of the semiconductor structure 110. In addition, the extending electrode 144 has a height of H3, and the height H2 is greater than the height H3, that is, the first insulating layer 120 still separates the semiconductor structure 110 from the extending electrode 144. In FIG. 18, the first insulating layer 120 covers only the second semiconductor layer 116 and a part of the light emitting layer 114 of the semiconductor structure 110, and does not cover the first semiconductor layer 112. However, in other embodiments, the first insulating layer 120 may cover only a part of the second semiconductor layer 116 or cover the second semiconductor layer 116, the light emitting layer 114, and a part of the first semiconductor layer 112, as long as the first insulating layer 120 can separate the semiconductor structure 110 from the extending electrode 144, which all fall within the scope of the present invention. Other details in this embodiment are similar to those in FIG. 17, and are not described again.

Figure 19:
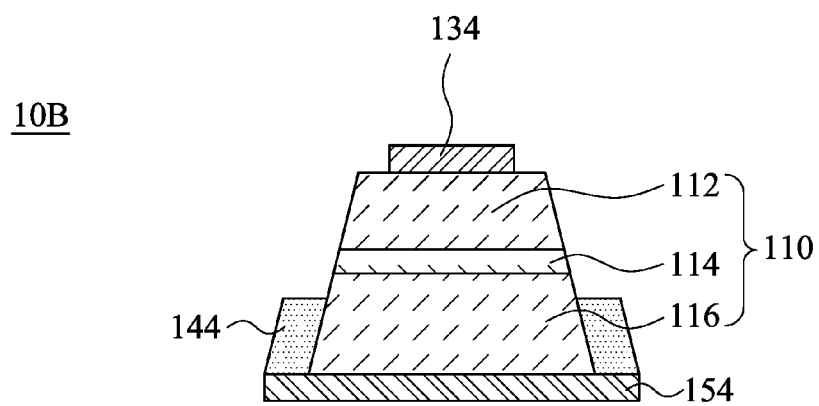
FIG. 19 is a sectional view of a light emitting device according to another embodiment of the present invention.

FIG. 19 is a sectional view of a light emitting device 10B according to another embodiment of the present invention. In FIG. 19, the first insulating layer 120 may be omitted, that is, the extending electrode 144 is in direct contact with the sidewall 111s of the semiconductor structure 110. Such disposition can reduce processing processes and costs, and a current path of the extending electrode 144 may be directly from the sidewall 111s to the second semiconductor layer 116, or from the extending electrode 144 to the second electrode 154 and to the second semiconductor layer 116. In addition, the extending electrode 144 is in contact with the second semiconductor layer 116 and is not in contact with the first semiconductor layer 112 and the light emitting layer 114. Other details in this embodiment are similar to those in FIG. 17, and are not described again.

Figure 20:
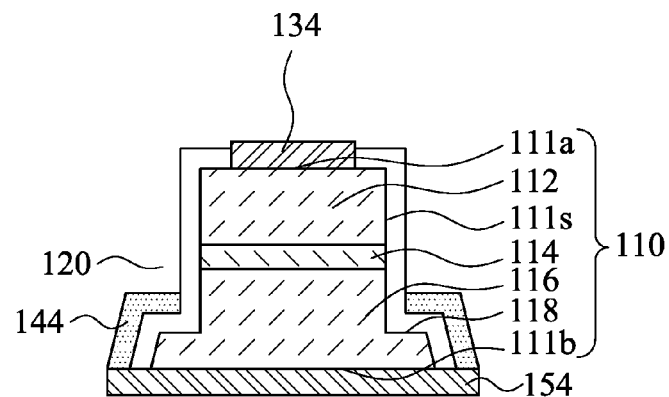
FIG. 20 is a sectional view of a light emitting device according to another embodiment of the present invention.

FIG. 20 is a sectional view of a light emitting device 10C according to another embodiment of the present invention. The difference between FIG. 20 and FIG. 17 lies in the shape of the semiconductor structure 110. In FIG. 20, the at least one sidewall 111s of the semiconductor structure 110 has at least one stair 118. For example, the sidewall 111s forms a platform due to the stair 118, and the height of the platform is lower than the height of the top surface 111a of the semiconductor structure 110. The extending electrode 144 may cover the stair 118. In this way, the electrode area (or the length) of the extending electrode 144 can be increased, so that the contact area between an external circuit and the extending electrode 144 is sufficient, to manufacture a structure for easier connection. In addition, in FIG. 20, the stair 118 is formed on at least two sidewalls 111s of the semiconductor structure 110, but in other embodiments, the stair 118 may be formed on one sidewall 111s or more than two sidewalls 111s of the semiconductor structure 110, and the present invention is not limited thereto. Other details in this embodiment are similar to those in FIG. 17, and are not described again.

Figure 21:
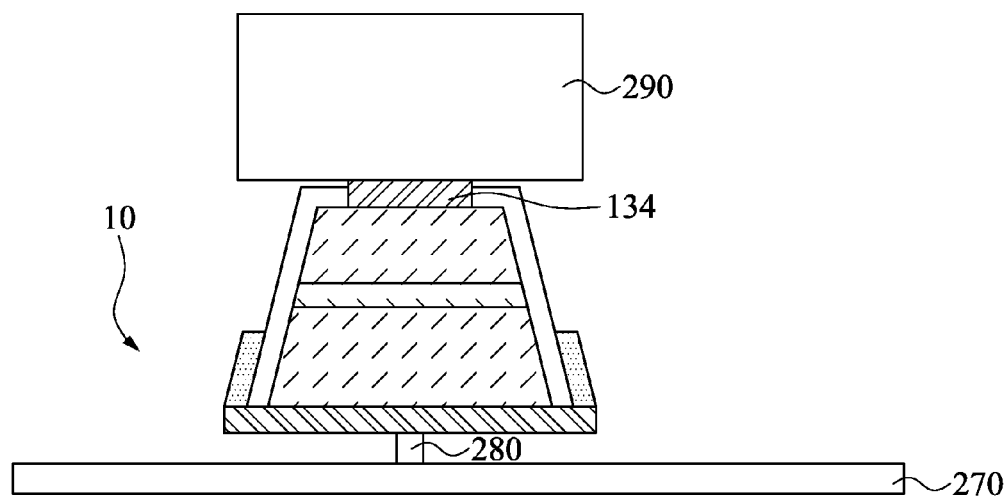
FIG. 21 to FIG. 27 are sectional views in a process of manufacturing a light emitting device according to an embodiment of the present invention.
Figure 26:
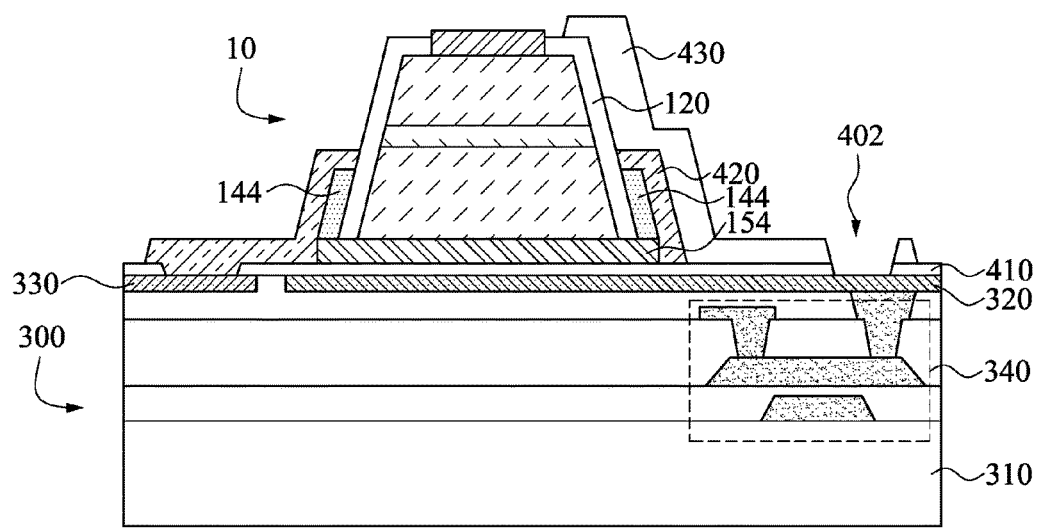
Figure 27:
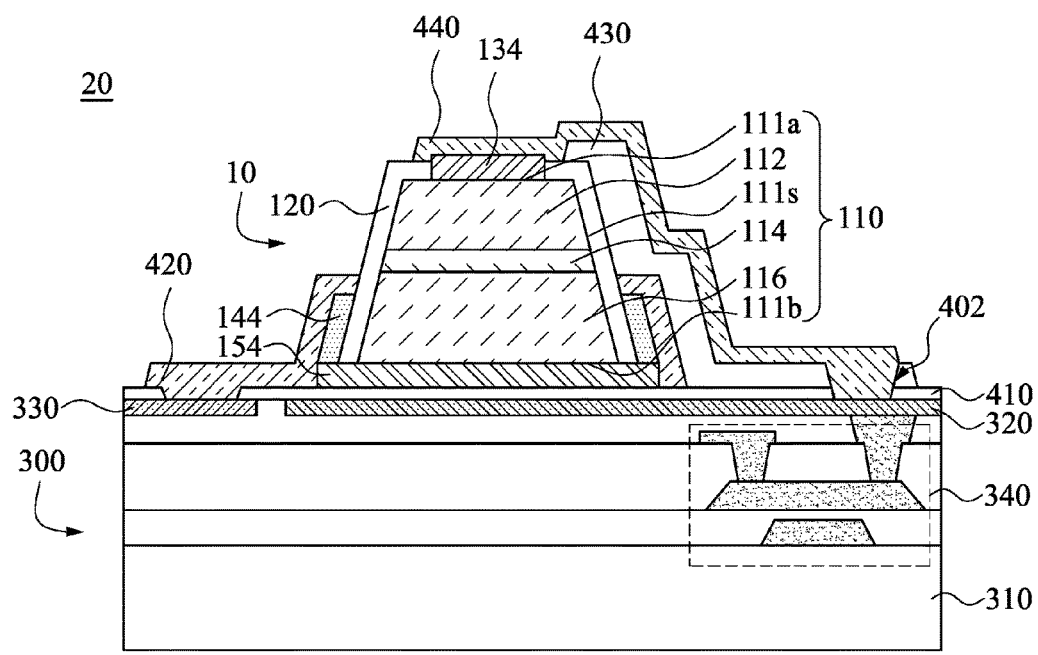
Figure 28:
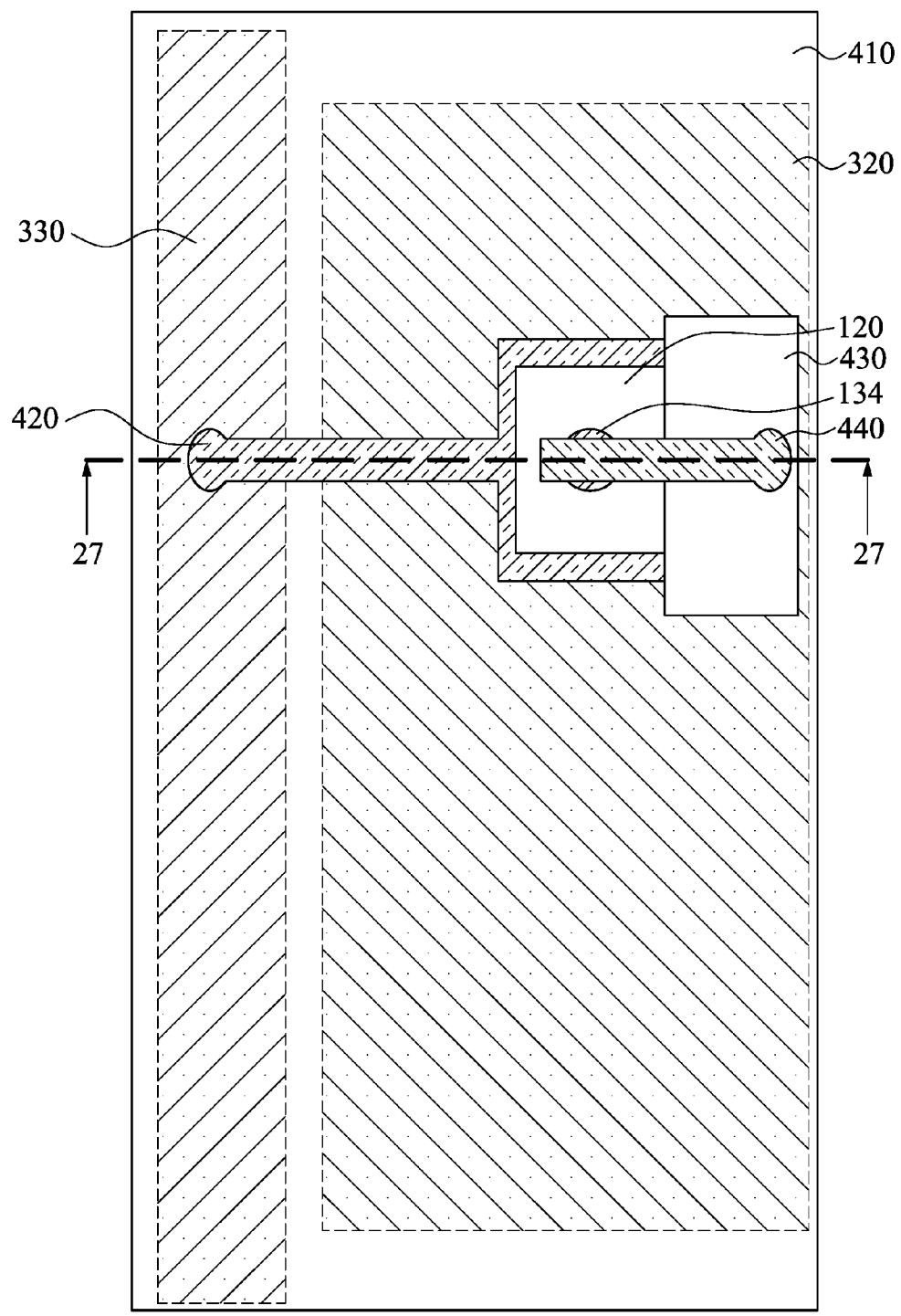
FIG. 28 is a top view of the light emitting device in FIG. 27.

Next, subsequent processing of the light emitting device 10 in FIG. 17 is described, to form a light emitting device 20 shown in FIG. 27. FIG. 21 to FIG. 27 are sectional views in a process of manufacturing a light emitting device 20 according to an embodiment of the present invention. FIG. 28 is a top view of the light emitting device 20 in FIG. 27. FIG. 27 is a sectional view along a line 27-27 in FIG. 28. For ease of description, the drawings of the present invention are merely examples for more easily understanding the present invention, and detailed scales thereof may be adjusted according to a design requirement. After the light emitting device 10 is processed, the light emitting device 10 is still disposed on the third substrate 270. In this case, the light emitting device 10 may be moved to a circuit board for assembly. As shown in FIG. 21, at least a part of the bonding layer 280 is removed, so that the light emitting device 10 is fastened onto the third substrate 270 through only the rest of the bonding layer 280. In some embodiments, a chemical lift off method or other appropriate methods may be used to etch the bonding layer 280.

Next, a transfer stamp 290 is fastened onto the light emitting device 10. For example, the transfer stamp 290 is fastened onto the first electrode 134 of the light emitting device 10. In some embodiments, the transfer stamp 290 may be made of a polymer, for example, polydimethylsiloxane (PDMS) or other appropriate materials.

Figure 22:
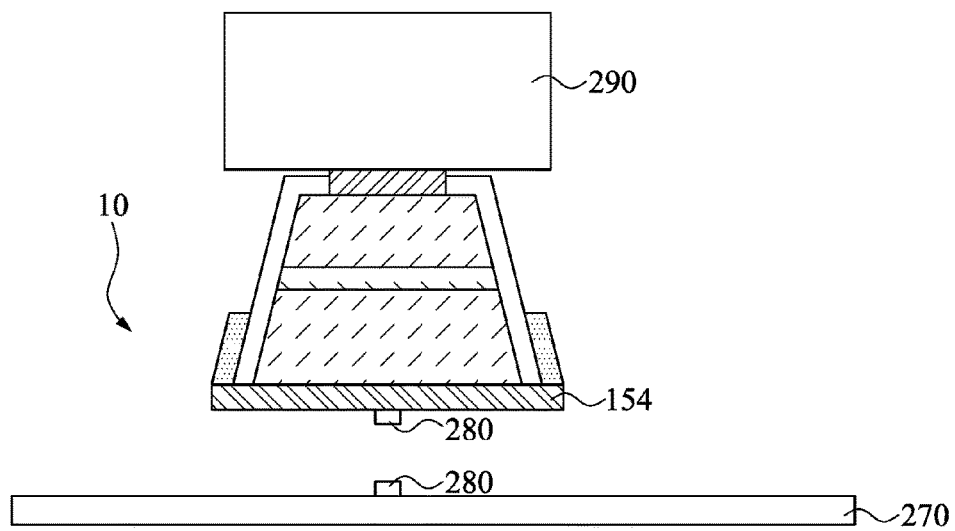

Referring to FIG. 22, the light emitting device 10 is moved by using the transfer stamp 290, to separate the light emitting device 10 from the third substrate 270, and specifically, separate the second electrode 154 of the light emitting device 10 from the third substrate 270. In this embodiment, when the transfer stamp 290 moves, the rest of the bonding layer 280 is destroyed so as to separate the light emitting device 10 from the third substrate 270.

Figure 23:
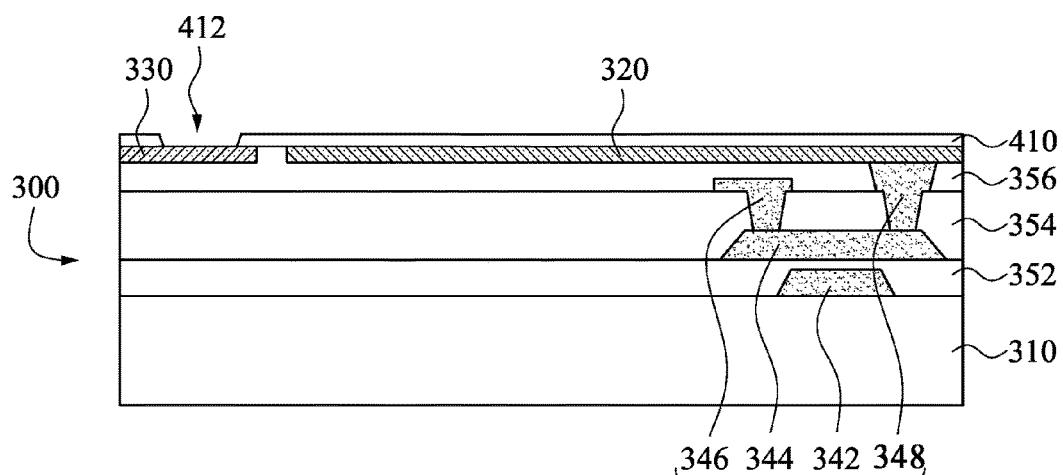

Referring to FIG. 23, a circuit board 300 is provided. The circuit board 300 includes a fourth substrate 310, a first conductive layer 320, a second conductive layer 330, and an active element 340. In addition, the circuit board 300 further has an adhesive layer 410. The active element 340 is disposed between the fourth substrate 310 and the adhesive layer 410. The first conductive layer 320 and the second conductive layer 330 are disposed between the active element 340 and the adhesive layer 410, and the first conductive layer 320 and the second conductive layer 330 are separated from each other, that is, the first conductive layer 320 and the second conductive layer 330 are separated by a gap. The first conductive layer 320 is electrically connected to the active element 340. The active element 340 may be a thin-film transistor, and includes a gate 342, a channel layer 344, a source 346, and a drain 348. The circuit board 300 further includes a plurality of dielectric layers 352, 354, and 356. The dielectric layer 352 is disposed between the gate 342 and the channel layer 344, the dielectric layer 354 is disposed between the channel layer 344, the source 346, and the drain 348, and the dielectric layer 356 is disposed between the active element 340 and the first conductive layer 320. The source 346 and the gate 342 are each electrically connected to a signal source (not shown), and the drain 348 is electrically connected to the first conductive layer 320. In addition, the second conductive layer 330 may be electrically connected to another signal source (for example, a common electrode, not shown). In FIG. 23, the active element 340 is a bottom gate transistor. However, in other implementation manners, the active element 340 may be other appropriate elements, for example, a top gate transistor, and the present invention is not limited thereto.

The adhesive layer 410 has an opening 412, and the second conductive layer 330 is exposed via the opening 412. In some embodiments, the resistivity of the adhesive layer 410 is greater than $10^8$ ohm-centimeter, that is, the adhesive layer 410 not only is adhesive, but also is essentially insulative. The adhesive layer 410 may be made of photoresist, silica gel, epoxy resin, or a combination thereof, and the present invention is not limited thereto. In addition, in some implementation manners, the adhesive layer 410 is still adhesive at room temperature. The first conductive layer 320 and the second conductive layer 330 may be made of a material including a non-transparent conductive material such as silver, aluminum, copper, magnesium, or molybdenum, a transparent conductive material such as indium tin oxide, indium zinc oxide, or aluminum zinc oxide, a composite layer of the materials, or an alloy of the materials, but the present invention is not limited thereto.

Figure 24:
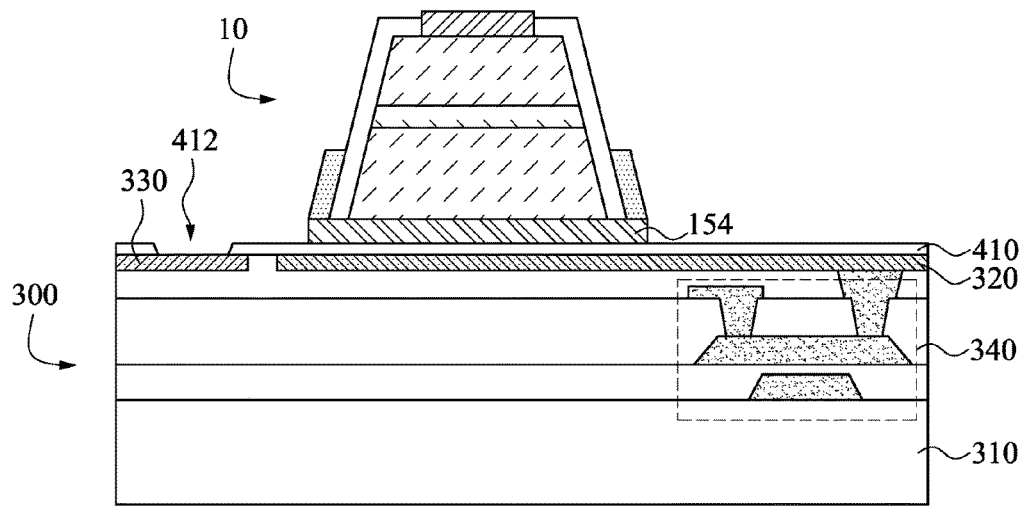

Referring to FIG. 24, transfer processing is performed on the light emitting device 10. Specifically, the transfer stamp 290 in FIG. 22 transfer the light emitting device 10 onto the circuit board 300, so that the light emitting device 10 is fastened onto the circuit board 300 through the adhesive layer 410. Specifically, the second electrode 154 of the light emitting device 10 is in contact with the adhesive layer 410. Next, through the adhesiveness of the adhesive layer 410, the transfer stamp 290 can be separated from the light emitting device 10.

In FIG. 24, because the adhesive layer 410 is still adhesive at room temperature, when the transfer stamp 290 places the light emitting device 10 on the circuit board 300, high temperature and high pressure processing can be avoided. The transfer stamp 290 and another element (for example, the light emitting device 10 and the circuit board 300) may differ in coefficients of thermal expansion, and high temperature processing may cause inaccurate alignment or poor electric contact and decrease the yield. Therefore, the yield can be increased when the transposition processing is performed at room temperature.

Figure 25:
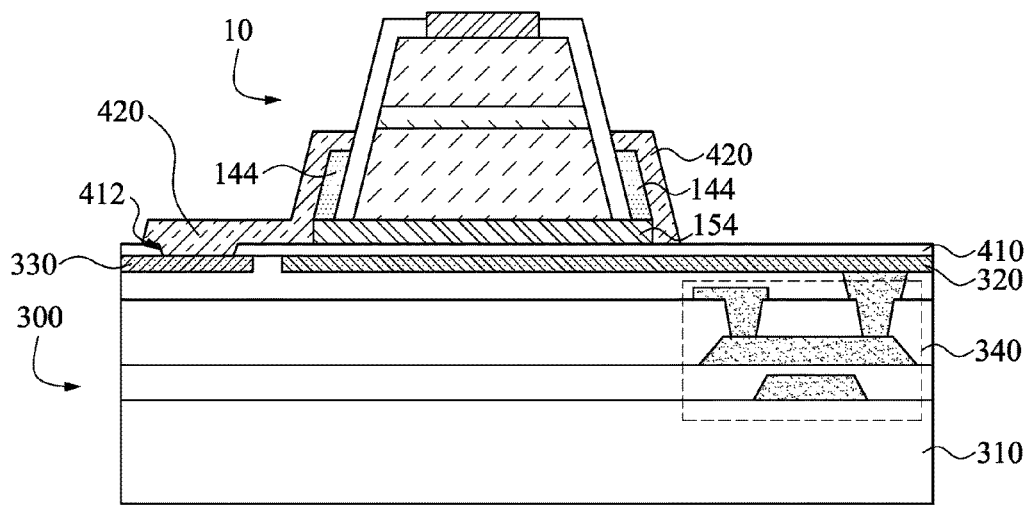

Referring to FIG. 25, a connecting layer 420 is formed to cover at least a part of the extending electrode 144 and is connected to the second conductive layer 330. The connecting layer 420 is in contact with the second conductive layer 330 via the opening 412. In FIG. 25, the connecting layer 420 completely covers the extending electrode 144. However, in other embodiments, the connecting layer 420 may cover a part of the extending electrode 144, as long as the connecting layer 420 can be electrically connected to the extending electrode 144, which all fall within the present invention. The connecting layer 420 may be made of a material including a non-transparent conductive material such as silver, aluminum, copper, magnesium, or molybdenum, a transparent conductive material such as indium tin oxide, indium zinc oxide, or aluminum zinc oxide, a composite layer of the materials, or an alloy of the materials, but the present invention is not limited thereto.

Referring to FIG. 26, a second insulating layer 430 is formed to cover at least a part of the connecting layer 420. For example, the second insulating layer 430 may cover a part of the first insulating layer 120 and a part of the connecting layer 420. Therefore, the connecting layer 420 is disposed between the second insulating layer 430 and the extending electrode 144. The second insulating layer 430 may be made of a dielectric material, and a method of manufacturing the second insulating layer 430 may be PECVD, but the present invention is not limited thereto, and other appropriate processing manners, such as screen printing, coating, and ink jet, may be used. In other embodiments, the second insulating layer 430 may be made of the following inorganic material and/or organic material. The inorganic material may be, for example, silicon oxide, silicon nitride, silicon oxynitride, silicon carbide, hafnium oxide, or aluminum oxide, or other appropriate materials. The organic material may be, for example, photoresist, benzocyclobutene, cycloalkene, polyimide, polyamide, polyester, polyol, polyethylene oxide, polyphenyl, resin, polyether, polyketone, or other appropriate materials. The foregoing descriptions are merely examples, and the present invention is not limited thereto.

Next, a through hole 402 is formed in the second insulating layer 430 and the adhesive layer 410. For example, lithographic and etching processing or other appropriate patterning methods may be used to expose a part of the first conductive layer 320 via the through hole 402.

Next, referring to FIG. 27, a connecting layer 440 is formed on the second insulating layer 430, and is connected to the first electrode 134 and the first conductive layer 320. The connecting layer 440 is in contact with the first conductive layer 320 via the through hole 402. The connecting layer 440 may be made of a material including a non-transparent conductive material such as silver, aluminum, copper, magnesium, or molybdenum, a transparent conductive material such as indium tin oxide, indium zinc oxide, or aluminum zinc oxide, a composite layer of the materials, or an alloy of the materials, but the present invention is not limited thereto. In FIG. 27 and FIG. 28, the pattern of the second insulating layer 430 is not limited, as long as the second insulating layer 430 can be disposed between the connecting layer 420 and the connecting layer 440 so that the connecting layer 420 and the connecting layer 440 are electrically separated from each other, which all fall within the scope of the present invention. For example, the second insulating layer 430 may cover one or more or all sidewalls 111s of the semiconductor structure 110.

After the processing in FIG. 27 is finished, the processing of the light emitting device 20 is finished. Referring to FIG. 27 and FIG. 28, as seen from the structure, the second electrode 154 is disposed between the semiconductor structure 110 and the fourth substrate 310 of the circuit board 300, and the adhesive layer 410 is disposed between the fourth substrate 310 and the second electrode 154. The connecting layer 420 is electrically connected to the extending electrode 144 and the second conductive layer 330. The second insulating layer 430 covers a part of the extending electrode 144, a part of the connecting layer 420, and the sidewall 111s of the semiconductor structure 110. The connecting layer 440 is disposed on the second insulating layer 430, and is connected to the first electrode 134 and the first conductive layer 320. In this embodiment, the first semiconductor layer 112 may be a P-type semiconductor layer, and the second semiconductor layer 116 may be an N-type semiconductor layer. In this way, a current can be formed in the semiconductor structure 110 by adding a bias between the connecting layer 420 and the connecting layer 440, to drive the light emitting layer 114 of the semiconductor structure 110 to emit light.

In some embodiments, the semiconductor structure 110 is disposed on the first conductive layer 320. In this way, when a conductive material having high reflectivity (for example, metal) is selected as the material of the first conductive layer 320, light emitted by the semiconductor structure 110 to the circuit board 300 can be reflected to an emergent surface of the semiconductor structure 110 (for example, the top surface 111a).

The light emitting device 20 in FIG. 28 may represent a pixel of a display panel. In FIG. 28, only one light emitting device 10 is placed on the first conductive layer 320. However, in other embodiments, a plurality of light emitting devices 10 may be placed on the first conductive layer 320 to increase luminance.

Figure 29:
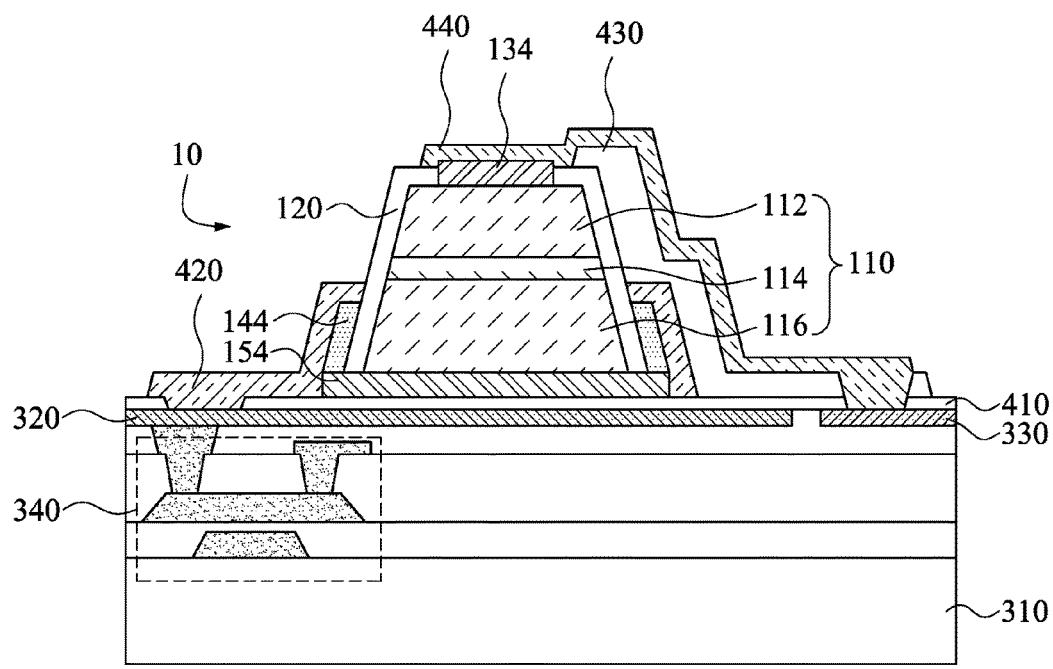
FIG. 29 is a sectional view of a light emitting device according to another embodiment of the present invention.

FIG. 29 is a sectional view of a light emitting device 20A according to another embodiment of the present invention. The difference between FIG. 29 and FIG. 27 lies in the electrical connection between the light emitting device 10 and the circuit board 300. In FIG. 29, the connecting layer 420 is connected to the extending electrode 144 and the first conductive layer 320, and the first conductive layer 320 is connected to the active element 340. The connecting layer 440 is connected to the first electrode 134 and the second conductive layer 330. The first semiconductor layer 112 may be an N-type semiconductor layer, and the second semiconductor layer 116 may be a P-type semiconductor layer. Other details in this embodiment are similar to those in FIG. 27, and are not described again.

Although the present invention is disclosed above by using the foregoing embodiments, these embodiments are not intended to limit the present invention. Various changes and modifications made without departing from the spirit and scope of the present invention shall fall within the protection scope of the present invention. The protection scope of the present invention is subject to the appended claims.

What is claimed is:

1. A light emitting device, comprising:
   a semiconductor structure, having at least one sidewall, wherein the semiconductor structure comprises:
      a light emitting layer;
      a first semiconductor layer; and
      a second semiconductor layer, wherein the light emitting layer is disposed between the first semiconductor layer and the second semiconductor layer;
   a first electrode, electrically connected to the first semiconductor layer of the semiconductor structure, wherein the first semiconductor layer is disposed between the light emitting layer and the first electrode;
   a second electrode, electrically connected to the second semiconductor layer of the semiconductor structure, wherein the second semiconductor layer is disposed between the light emitting layer and the second electrode;
   at least one extending electrode, disposed on the at least one sidewall of the semiconductor structure, and electrically connected to the second electrode;
   a substrate, wherein the second electrode is disposed between the substrate and the semiconductor structure;
   an adhesive layer, disposed between the substrate and the second electrode;
   an active element, disposed between the substrate and the adhesive layer;
   a first conductive layer, disposed between the active element and the adhesive layer;
   a second conductive layer, disposed between the active element and the adhesive layer, wherein the second conductive layer and the first conductive layer are separated by a gap, and the active element is electrically connected to either the first conductive layer or the second conductive layer;
   a first connecting layer, wherein one of the first conductive layer and the second conductive layer is electrically connected to the semiconductor structure through the first connecting layer;
   a second connecting layer, wherein another of the first conductive layer and the second conductive layer is electrically connected to the semiconductor structure through the second connecting layer; and
   a first insulating layer, covering a part of the extending electrode and the at least one sidewall of the semiconductor structure;
   wherein the first connecting layer is disposed on the first insulating layer and electrically connected to the first electrode and the first conductive layer; and
   wherein the second connecting layer is electrically connected to the extending electrode and the second conductive layer.

2. The light emitting device according to claim 1, wherein the semiconductor structure further has a top surface and a bottom surface that are opposite to each other, an angle is formed between the bottom surface and the at least one sidewall of the semiconductor structure, and the angle is an acute angle.

3. The light emitting device according to claim 1, wherein the area of the bottom surface of the semiconductor structure is greater than the area of the top surface of the semiconductor structure.

4. The light emitting device according to claim 1, wherein the second electrode protrudes from the second semiconductor layer.

5. The light emitting device according to claim 1, wherein the at least one sidewall of the semiconductor structure has at least one stair.

6. The light emitting device according to claim 1, further comprising a second insulating layer, at least disposed between the semiconductor structure and the extending electrode.

7. The light emitting device according to claim 6, wherein the height of the second insulating layer is lower than the height of the semiconductor structure.

8. The light emitting device according to claim 6, wherein the semiconductor structure further has a top surface, and the second insulating layer further covers a part of the top surface and is adjacent to the first electrode.

9. The light emitting device according to claim 1, wherein the resistivity of the adhesive layer is greater than $10^8$ ohm-centimeter.

10. The light emitting device according to claim 1, wherein the semiconductor structure is disposed on the first conductive layer.

11. The light emitting device according to claim 1, wherein a part of the second connecting layer is further disposed between the first insulating layer and the extending electrode.

12. The light emitting device according to claim 1, wherein the first semiconductor layer, the light emitting layer, and the second semiconductor layer are stacked together to a first height from a substrate;
   wherein the extending electrode extends to a second height from said substrate; and
   wherein the first height is greater than the second height.

* * * * *